(12) United States Patent
Costa et al.

(10) Patent No.: US 10,038,055 B2
(45) Date of Patent: Jul. 31, 2018

(54) SUBSTRATE STRUCTURE WITH EMBEDDED LAYER FOR POST-PROCESSING SILICON HANDLE ELIMINATION

(71) Applicant: Qorvo US, Inc., Greensboro, NC (US)

(72) Inventors: Julio C. Costa, Oak Ridge, NC (US); Jan Edward Vandemeer, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/648,082

(22) Filed: Jul. 12, 2017

(65) Prior Publication Data
US 2017/0309709 A1    Oct. 26, 2017

Related U.S. Application Data

(62) Division of application No. 15/085,185, filed on Mar. 30, 2016.

(Continued)

(51) Int. Cl.
*H01L 21/461* (2006.01)
*H01L 29/06* (2006.01)
(Continued)

(52) U.S. Cl.
CPC ...... *H01L 29/0692* (2013.01); *H01L 21/6835* (2013.01); *H01L 21/76251* (2013.01);
(Continued)

(58) Field of Classification Search
CPC .......... H01L 21/6835; H01L 21/76251; H01L 21/6854; H01L 21/76256; H01L 21/76259;
(Continued)

(56) References Cited

U.S. PATENT DOCUMENTS 4,093,562 A    6/1978  Kishimoto
4,366,202 A   12/1982  Borovsky
(Continued)

FOREIGN PATENT DOCUMENTS

CN    103811474 A    5/2014
EP      2996143 A1   3/2016
(Continued)

OTHER PUBLICATIONS

Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.

(Continued)

*Primary Examiner* — Stephen W Smoot
(74) *Attorney, Agent, or Firm* — Withrow & Terranova, P.L.L.C.

(57) ABSTRACT

The present disclosure relates to a substrate structure with a buried dielectric layer for post-processing silicon handle elimination. The substrate structure includes a silicon handle layer, a first silicon oxide layer over the silicon handle layer, a buried dielectric layer over the first silicon oxide layer, where the buried dielectric layer is not formed from silicon oxide, a second silicon oxide layer over the buried dielectric layer, and a silicon epitaxy layer over the second silicon oxide layer. The buried dielectric layer provides extremely selective etch stop characteristics with respect to etching chemistries for silicon and silicon oxide.

20 Claims, 10 Drawing Sheets

Related U.S. Application Data

(60) Provisional application No. 62/165,446, filed on May 22, 2015.

(51) Int. Cl.
*H01L 21/683* (2006.01)
*H01L 21/762* (2006.01)
*H01L 29/16* (2006.01)

(52) U.S. Cl.
CPC .... *H01L 21/76256* (2013.01); *H01L 29/0649* (2013.01); *H01L 29/16* (2013.01); *H01L 2221/6834* (2013.01); *H01L 2221/68327* (2013.01); *H01L 2221/68368* (2013.01)

(58) Field of Classification Search
CPC ... H01L 2221/68327; H01L 2221/6834; H01L 2221/68368; H01L 29/0649; H01L 29/0692; H01L 29/16
See application file for complete search history.

(56) References Cited

U.S. PATENT DOCUMENTS

| | | | |
|---|---|---|---|
| 5,061,663 A | 10/1991 | Bolt et al. | |
| 5,069,626 A | 12/1991 | Patterson et al. | |
| 5,391,257 A | 2/1995 | Sullivan et al. | |
| 5,459,368 A | 10/1995 | Onishi et al. | |
| 5,646,432 A | 7/1997 | Iwaki et al. | |
| 5,648,013 A | 7/1997 | Uchida et al. | |
| 5,699,027 A | 12/1997 | Tsuji et al. | |
| 5,709,960 A | 1/1998 | Mays et al. | |
| 5,831,369 A | 11/1998 | Fürbacher et al. | |
| 5,920,142 A | 7/1999 | Onishi et al. | |
| 6,072,557 A | 6/2000 | Kishimoto | |
| 6,084,284 A | 7/2000 | Adamic, Jr. | |
| 6,154,366 A | 11/2000 | Ma et al. | |
| 6,154,372 A | 11/2000 | Kalivas et al. | |
| 6,235,554 B1 | 5/2001 | Akram et al. | |
| 6,236,061 B1 | 5/2001 | Walpita | |
| 6,268,654 B1 | 7/2001 | Glenn et al. | |
| 6,271,469 B1 | 8/2001 | Ma et al. | |
| 6,423,570 B1 | 7/2002 | Ma et al. | |
| 6,426,559 B1 | 7/2002 | Bryan et al. | |
| 6,446,316 B1 | 9/2002 | Fürbacher et al. | |
| 6,578,458 B1 | 6/2003 | Akram et al. | |
| 6,649,012 B2 | 11/2003 | Masayuki et al. | |
| 6,713,859 B1 | 3/2004 | Ma | |
| 6,841,413 B2 | 1/2005 | Liu et al. | |
| 6,864,156 B1 | 3/2005 | Conn | |
| 6,902,950 B2 | 6/2005 | Ma et al. | |
| 6,943,429 B1 | 9/2005 | Glenn et al. | |
| 6,964,889 B2 | 11/2005 | Ma et al. | |
| 6,992,400 B2 | 1/2006 | Tikka et al. | |
| 7,042,072 B1 | 5/2006 | Kim et al. | |
| 7,049,692 B2 | 5/2006 | Nishimura et al. | |
| 7,109,635 B1 | 9/2006 | McClure et al. | |
| 7,183,172 B2 | 2/2007 | Lee et al. | |
| 7,288,435 B2 | 10/2007 | Aigner et al. | |
| 7,307,003 B2 | 12/2007 | Reif et al. | |
| 7,393,770 B2 | 7/2008 | Wood et al. | |
| 7,427,824 B2 | 9/2008 | Iwamoto et al. | |
| 7,596,849 B1 | 10/2009 | Carpenter et al. | |
| 7,619,347 B1 | 11/2009 | Bhattacharjee | |
| 7,635,636 B2 | 12/2009 | McClure et al. | |
| 7,714,535 B2 | 5/2010 | Yamazaki et al. | |
| 7,749,882 B2 | 7/2010 | Kweon et al. | |
| 7,790,543 B2 | 9/2010 | Abadeer et al. | |
| 7,855,101 B2 | 12/2010 | Furman et al. | |
| 7,868,419 B1 | 1/2011 | Kerr et al. | |
| 7,960,218 B2 | 6/2011 | Ma et al. | |
| 8,183,151 B2 | 5/2012 | Lake | |
| 8,420,447 B2 | 4/2013 | Tay et al. | |
| 8,503,186 B2 | 8/2013 | Lin et al. | |
| 8,643,148 B2 | 2/2014 | Lin et al. | |
| 8,664,044 B2 | 3/2014 | Jin et al. | |
| 8,772,853 B2 | 7/2014 | Hong et al. | |
| 8,791,532 B2 | 7/2014 | Graf et al. | |
| 8,802,495 B2 | 8/2014 | Kim et al. | |
| 8,816,407 B2 | 8/2014 | Kim et al. | |
| 8,835,978 B2 | 9/2014 | Mauder et al. | |
| 8,906,755 B1 | 12/2014 | Hekmatshoartabari et al. | |
| 8,921,990 B2 | 12/2014 | Park et al. | |
| 8,927,968 B2 | 1/2015 | Cohen et al. | |
| 8,941,248 B2 | 1/2015 | Lin et al. | |
| 8,963,321 B2 | 2/2015 | Lenniger et al. | |
| 9,165,793 B1 | 10/2015 | Wang et al. | |
| 9,368,429 B2 | 6/2016 | Ma et al. | |
| 9,461,001 B1 | 10/2016 | Tsai et al. | |
| 9,646,856 B2 | 5/2017 | Meyer et al. | |
| 9,859,254 B1 | 1/2018 | Yu et al. | |
| 9,941,245 B2 | 4/2018 | Skeete et al. | |
| 2001/0004131 A1 | 6/2001 | Masayuki et al. | |
| 2002/0070443 A1 | 6/2002 | Mu et al. | |
| 2002/0074641 A1 | 6/2002 | Towle et al. | |
| 2002/0127769 A1 | 9/2002 | Ma et al. | |
| 2002/0127780 A1 | 9/2002 | Ma et al. | |
| 2002/0137263 A1 | 9/2002 | Towle et al. | |
| 2002/0185675 A1 | 12/2002 | Furukawa | |
| 2004/0164367 A1 | 8/2004 | Park | |
| 2004/0166642 A1 | 8/2004 | Chen et al. | |
| 2004/0219765 A1 | 11/2004 | Reif et al. | |
| 2005/0037595 A1 | 2/2005 | Nakahata | |
| 2005/0079686 A1 | 4/2005 | Aigner et al. | |
| 2005/0212419 A1 | 9/2005 | Vazan et al. | |
| 2006/0057782 A1 | 3/2006 | Gardes et al. | |
| 2006/0108585 A1 | 5/2006 | Gan et al. | |
| 2006/0261446 A1 | 11/2006 | Wood et al. | |
| 2007/0020807 A1 | 1/2007 | Geefay et al. | |
| 2007/0069393 A1 | 3/2007 | Asahi | |
| 2007/0075317 A1 | 4/2007 | Kato et al. | |
| 2007/0121326 A1 | 5/2007 | Nall et al. | |
| 2007/0181992 A1 | 8/2007 | Lake | |
| 2007/0190747 A1 | 8/2007 | Humpston et al. | |
| 2007/0252481 A1 | 11/2007 | Iwamoto et al. | |
| 2007/0276092 A1 | 11/2007 | Kanae et al. | |
| 2008/0050852 A1 | 2/2008 | Hwang et al. | |
| 2008/0050901 A1 | 2/2008 | Kweon et al. | |
| 2008/0164528 A1 | 7/2008 | Cohen et al. | |
| 2008/0272497 A1 | 11/2008 | Lake | |
| 2008/0315372 A1 | 12/2008 | Kuan et al. | |
| 2009/0008714 A1 | 1/2009 | Chae | |
| 2009/0010056 A1 | 1/2009 | Kuo et al. | |
| 2009/0014856 A1 | 1/2009 | Knickerbocker | |
| 2009/0179266 A1 | 7/2009 | Abadeer et al. | |
| 2009/0261460 A1 | 10/2009 | Kuan et al. | |
| 2010/0012354 A1 | 1/2010 | Hedin et al. | |
| 2010/0029045 A1 | 2/2010 | Ramanathan et al. | |
| 2010/0045145 A1 | 2/2010 | Tsuda | |
| 2010/0081232 A1 | 4/2010 | Furman et al. | |
| 2010/0081237 A1 | 4/2010 | Wong et al. | |
| 2010/0109122 A1 | 5/2010 | Ding et al. | |
| 2010/0127340 A1 | 5/2010 | Sugizaki | |
| 2010/0173436 A1 | 7/2010 | Ouellet et al. | |
| 2010/0200919 A1 | 8/2010 | Kikuchi | |
| 2011/0003433 A1 | 1/2011 | Harayama et al. | |
| 2011/0026232 A1 | 2/2011 | Lin et al. | |
| 2011/0036400 A1 | 2/2011 | Murphy et al. | |
| 2011/0062549 A1 | 3/2011 | Lin | |
| 2011/0068433 A1 | 3/2011 | Kim et al. | |
| 2011/0102002 A1 | 5/2011 | Riehl et al. | |
| 2011/0171792 A1 | 7/2011 | Chang et al. | |
| 2011/0272800 A1 | 11/2011 | Chino | |
| 2011/0272824 A1 | 11/2011 | Pagaila | |
| 2011/0294244 A1 | 12/2011 | Hattori et al. | |
| 2012/0003813 A1 | 1/2012 | Chuang et al. | |
| 2012/0068276 A1 | 3/2012 | Lin et al. | |
| 2012/0094418 A1 | 4/2012 | Grama et al. | |
| 2012/0104495 A1 | 5/2012 | Zhu et al. | |
| 2012/0119346 A1 | 5/2012 | Im et al. | |
| 2012/0153393 A1 | 6/2012 | Liang et al. | |
| 2012/0168863 A1 | 7/2012 | Zhu et al. | |
| 2012/0256260 A1 | 10/2012 | Cheng et al. | |
| 2012/0292700 A1 | 11/2012 | Khakifirooz et al. | |

(56) References Cited

U.S. PATENT DOCUMENTS

| | | | |
|---|---|---|---|
| 2012/0299105 A1 | 11/2012 | Cai et al. | |
| 2013/0001665 A1 | 1/2013 | Zhu et al. | |
| 2013/0015429 A1 | 1/2013 | Hong et al. | |
| 2013/0049205 A1 | 2/2013 | Meyer et al. | |
| 2013/0099315 A1 | 4/2013 | Zhu et al. | |
| 2013/0105966 A1 | 5/2013 | Kelkar et al. | |
| 2013/0147009 A1 | 6/2013 | Kim | |
| 2013/0155681 A1 | 6/2013 | Nall et al. | |
| 2013/0196483 A1 | 8/2013 | Dennard et al. | |
| 2013/0200456 A1 | 8/2013 | Zhu et al. | |
| 2013/0280826 A1 | 10/2013 | Scanlan et al. | |
| 2013/0299871 A1 | 11/2013 | Mauder et al. | |
| 2014/0035129 A1 | 2/2014 | Stuber et al. | |
| 2014/0134803 A1 | 5/2014 | Kelly et al. | |
| 2014/0168014 A1 | 6/2014 | Chih et al. | |
| 2014/0197530 A1 | 7/2014 | Meyer et al. | |
| 2014/0210314 A1 | 7/2014 | Bhattacharjee et al. | |
| 2014/0252566 A1* | 9/2014 | Kerr | H01L 21/0237 257/635 |
| 2014/0252567 A1 | 9/2014 | Carroll et al. | |
| 2014/0264813 A1 | 9/2014 | Lin et al. | |
| 2014/0264818 A1 | 9/2014 | Lowe, Jr. et al. | |
| 2014/0306324 A1 | 10/2014 | Costa et al. | |
| 2014/0327003 A1 | 11/2014 | Fuergut et al. | |
| 2014/0327150 A1 | 11/2014 | Jung et al. | |
| 2014/0346573 A1 | 11/2014 | Adam et al. | |
| 2015/0115416 A1 | 4/2015 | Costa et al. | |
| 2015/0130045 A1 | 5/2015 | Tseng et al. | |
| 2015/0235990 A1 | 8/2015 | Cheng et al. | |
| 2015/0235993 A1 | 8/2015 | Cheng et al. | |
| 2015/0243881 A1 | 8/2015 | Sankman et al. | |
| 2015/0255368 A1 | 9/2015 | Costa | |
| 2015/0262844 A1 | 9/2015 | Meyer et al. | |
| 2015/0279789 A1 | 10/2015 | Mahajan et al. | |
| 2015/0311132 A1 | 10/2015 | Kuo et al. | |
| 2015/0364344 A1 | 12/2015 | Yu et al. | |
| 2015/0380523 A1* | 12/2015 | Hekmatshoartabari | H01L 27/1222 438/166 |
| 2016/0002510 A1 | 1/2016 | Champagne et al. | |
| 2016/0079137 A1 | 3/2016 | Leipold et al. | |
| 2016/0093580 A1 | 3/2016 | Scanlan et al. | |
| 2016/0155706 A1 | 6/2016 | Yoneyama et al. | |
| 2016/0284568 A1 | 9/2016 | Morris et al. | |
| 2016/0343592 A1 | 11/2016 | Costa et al. | |
| 2016/0343604 A1 | 11/2016 | Costa et al. | |
| 2017/0190572 A1 | 7/2017 | Pan et al. | |

FOREIGN PATENT DOCUMENTS

| | | |
|---|---|---|
| JP | 2006005025 A | 1/2006 |
| JP | 2007227439 A | 9/2007 |
| JP | 2008235490 A | 10/2008 |
| JP | 2008279567 A | 11/2008 |
| JP | 2009026880 A | 2/2009 |
| JP | 2009530823 A | 8/2009 |
| WO | 2007074651 A1 | 7/2007 |

OTHER PUBLICATIONS

Anderson, D.R., "Thermal Conductivity of Polymers," Sandia Corporation, Mar. 8, 1966, pp. 677-690.

Author Unknown, "CoolPoly D5108 Thermally Conductive Polyphenylene Sulfide (PPS)," Cool Polymers, Inc., Aug. 8, 2007, 2 pages.

Author Unknown, "CoolPoly D5506 Thermally Conductive Liquid Crystalline Polymer (LCP)," Cool Polymers, Inc., Dec. 12, 2013, 2 pages.

Author Unknown, "CoolPoly D-Series—Thermally Conductive Dielectric Plastics," Cool Polymers, Retrieved Jun. 24, 2013, http://coolpolymers.com/dseries.asp, 1 page.

Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.

Author Unknown, "CoolPoly E3605 Thermally Conductive Polyamide 4,6 (PA 4,6)," Cool Polymers, Inc., Aug. 4, 2007, 1 page, http://www.coolpolymers.com/Files/DS/Datasheet_e3605.pdf.

Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.

Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.

Author Unknown, "CoolPoly Selection Tool," Cool Polymers, Inc., 2006, 1 page, http://www.coolpolymers.com/select.asp?Application=Substrates+%26+Electcronic_Packaging.

Author Unknown, "CoolPoly Thermally Conductive Plastics for Dielectric Heat Plates," Cool Polymers, Inc., 2006, 2 pages, http://www.coolpolymers.com/heatplate.asp.

Author Unknown, "CoolPoly Thermally Conductive Plastics for Substrates and Electronic Packaging," Cool Polymers, Inc., 2005, 1 page.

Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.

Author Unknown, "Heat Transfer," Cool Polymers, Inc., 2006, http://www.coolpolymers.com/heattrans.html, 2 pages.

Author Unknown, "Plastics that Conduct Heat," Plastics Technology Online, Jun. 2001, Retrieved Jun. 24, 2013, http://www.ptonline.com/articles/plastics-that-conduct-heat, 4 pages.

Author Unknown, "Sapphire Substrate," from CRC Handbook of Chemistry and Physics, Date Unknown, 1 page.

Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.

Author Unknown, "Thermal Properties of Solids," PowerPoint Presentation, No Date, 28 slides, http://www.phys.huji.ac.il/Phys_Hug/Lectures/77602/PHONONS_2_thermal.pdf.

Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.

Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.

Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.

Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.

Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.

Costa, J., "RFCMOS SOI Technology for 4G Reconfigurable RF Solutions," Session WEC1-2, Proceedings of the 2013 IEEE International Microwave Symposium, 4 pages.

Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.

Finne, R. M. et al., "A Water-Amine-Complexing Agent System for Etching Silicon," Journal of The Electrochemical Society, vol. 114, No. 9, Sep. 1967, pp. 965-970.

(56) References Cited

OTHER PUBLICATIONS

Gamble, H. S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III-V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMS-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.
Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 14/315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 14/529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, dated Feb. 22, 2013, 58 pages.
Office Action for Japanese Patent Application No. 2011-229152, dated May 10, 2013, 7 pages.
Final Rejection for Japanese Patent Application No. 2011-229152, dated Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.

(56) References Cited

OTHER PUBLICATIONS

Author Unknown, "96% Alumina, thick-film, as fired," MatWeb, Date Unknown, date accessed Apr. 6, 2016, 2 pages, http://www.matweb.com/search/DataSheet.aspx?MatGUID=3996a734395a4870a9739076918c4297&ckck=1.
Author Unknown, "PolyOne Therma-Tech™ LC-5000C TC LCP," MatWeb, Date Unknown, date accessed Apr. 6, 2016, 2 pages, http://www.matweb.com/search/datasheettext.aspx?matguid=89754e8bb26148d083c5ebb05a0cbff1.
Author Unknown, "The Technology: Akhan's Approach and Solution: The Miraj Diamond™ Platform," 2015, accessed Oct. 9, 2016, http://www.akhansemi.com/technology.html#the-miraj-diamond-platform, 5 pages.
Micak R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Non-Final Office Action for U.S. Appl. No. 15/293,947, dated Apr. 7, 2017, 12 pages.
Notice of Allowance for U.S. Appl. No. 15/293,947, dated Aug. 14, 2017, 7 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Notice of Allowance for U.S. Appl. No. 14/851,652, dated Apr. 11, 2017, 9 pages.
Corrected Notice of Allowance for U.S. Appl. No. 14/851,652, dated Jul. 24, 2017, 6 pages.
Non-Final Office Action for U.S. Appl. No. 15/173,037, dated Jan. 10, 2017, 8 pages.
Final Office Action for U.S. Appl. No. 15/173,037, dated May 2, 2017, 13 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/085,185, dated Feb. 15, 2017, 10 pages.
Non-Final Office Action for U.S. Appl. No. 15/085,185, dated Jun. 6, 2017, 5 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Non-Final Office Action for U.S. Appl. No. 15/353,346, dated May 23, 2017, 15 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Non-Final Office Action for U.S. Appl. No. 14/885,202, dated Apr. 14, 2016, 5 pages.
Final Office Action for U.S. Appl. No. 14/885,202, dated Sep. 27, 2016, 7 pages.
Advisory Action for U.S. Appl. No. 14/885,202, dated Nov. 29, 2016, 3 pages.
Notice of Allowance for U.S. Appl. No. 14/885,202, dated Jan. 27, 2017, 7 pages.
Notice of Allowance for U.S. Appl. No. 14/885,202, dated Jul. 24, 2017, 8 pages.
Notice of Allowance for U.S. Appl. No. 14/885,243, dated Aug. 31, 2016, 8 pages.
Costa, J. et al., "Integrated MEMS Switch Technology on SOI-CMOS," Proceedings of Hilton Head Workshop: A Solid-State Sensors, Actuators and Microsystems Workshop, Jun. 1-5, 2008, Hilton Head Island, SC, IEEE, 4 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, dated Sep. 7, 2017, 5 pages.
Non-Final Office Action for U.S. Appl. No. 15/652,867, dated Oct. 10, 2017, 5 pages.
U.S. Appl. No. 14/261,029, filed Apr. 24, 2014; now U.S. Pat. No. 9,214,337.
U.S. Appl. No. 14/529,870, filed Oct. 31, 2014; now U.S. Pat. No. 9,583,414.
U.S. Appl. No. 15/293,947, filed Oct. 14, 2016.
U.S. Appl. No. 14/715,830, filed May 19, 2015.
U.S. Appl. No. 15/616,109, filed Jun. 7, 2017.
U.S. Appl. No. 14/851,652, filed Sep. 11, 2015.
U.S. Appl. No. 14/872,910, filed Oct. 1, 2015.
U.S. Appl. No. 14/885,202, filed Oct. 16, 2015.
U.S. Appl. No. 14/885,243, filed Oct. 16, 2015; now U.S. Pat. No. 9,530,709.
U.S. Appl. No. 15/387,855, filed Dec. 22, 2016.
U.S. Appl. No. 14/959,129, filed Dec. 4, 2015.
U.S. Appl. No. 15/173,037, filed Jun. 3, 2016.
U.S. Appl. No. 15/229,780, filed Aug. 5, 2016.
U.S. Appl. No. 15/262,457, filed Sep. 12, 2016.
U.S. Appl. No. 15/408,560, filed Jan. 18, 2017.
U.S. Appl. No. 15/287,202, filed Oct. 6, 2016.
U.S. Appl. No. 15/353,346, filed Nov. 16, 2016.
U.S. Appl. No. 15/652,826, filed Jul. 18, 2017.
U.S. Appl. No. 15/287,273, filed Oct. 6, 2016.
U.S. Appl. No. 15/652,867, filed Jul. 18, 2017.
U.S. Appl. No. 15/491,064, filed Apr. 19, 2017.
U.S. Appl. No. 15/601,858, filed May 22, 2017.
U.S. Appl. No. 15/695,579, filed Sep. 5, 2017.
U.S. Appl. No. 15/695,629, filed Sep. 5, 2017.
Fillion R. et al., "Development of a Plastic Encapsulated Multichip Technology for High Volume, Low Cost Commercial Electronics," Electronic Components and Technology Conference, vol. 1, May 1994, IEEE, 5 pages.
International Search Report and Written Opinion for PCT/US2017/046744, dated Nov. 27, 2017, 17 pages.
International Search Report and Written Opinion for PCT/US2017/046758, dated Nov. 16, 2017, 19 pages.
International Search Report and Written Opinion for PCT/US2017/046779, dated Nov. 29, 2017, 17 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud AL et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Final Office Action for U.S. Appl. No. 15/262,457, dated Dec. 19, 2017, 12 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Non-Final Office Action for U.S. Appl. No. 15/652,826, dated Nov. 3, 2017, 5 pages.
Supplemental Notice of Allowability for U.S. Appl. No. 15/287,273, dated Jan. 17, 2018, 5 pages.

(56) References Cited

OTHER PUBLICATIONS

Non-Final Office Action for U.S. Appl. No. 15/491,064, dated Jan. 2, 2018, 9 pages.
Notice of Allowance for U.S. Appl. No. 15/498,040, dated Feb. 20, 2018, 8 pages.
Non-Final Office Action for U.S. Appl. No. 15/387,855, dated Jan. 16, 2018, 7 pages.
Non-Final Office Action for U.S. Appl. No. 15/795,915, dated Feb. 23, 2018, 6 pages.
International Preliminary Report on Patentability for PCT/US2016/045809, dated Feb. 22, 2018, 8 pages.
Advisory Action and Applicant-Initiated Interview Summary for U.S. Appl. No. 15/262,457, dated Feb. 28, 2018, 5 pages.
Supplemental Notice of Allowability for U.S. Appl. No. 15/287,273, dated Feb. 23, 2018, 5 pages.
Non-Final Office Action for U.S. Appl. No. 15/676,415, dated Mar. 27, 2018, 14 pages.
Non-Final Office Action for U.S. Appl. No. 15/676,621, dated Mar. 26, 2018, 16 pages.
Final Office Action for U.S. Appl. No. 15/616,109, dated Apr. 19, 2018, 18 pages.
Non-Final Office Action for U.S. Appl. No. 15/261,457, dated Apr. 19, 2018, 10 pages.
Notice of Allowance for U.S. Appl. No. 15/491,164, dated Apr. 30, 2018, 9 pages.
Non-Final Office Action for U.S. Appl. No. 15/676,693, dated May 3, 2018, 14 pages.

\* cited by examiner

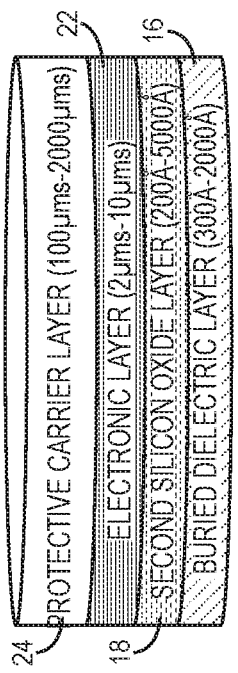
FIG. 5C
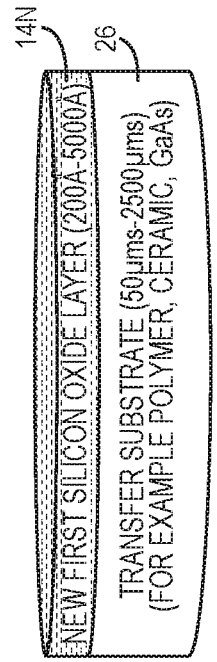
FIG. 5D
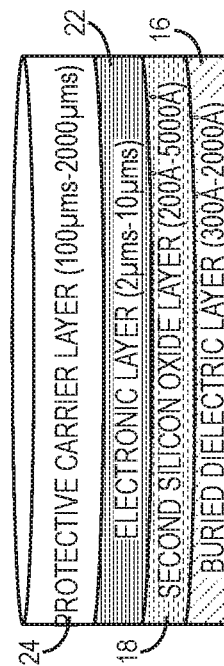

SUBSTRATE STRUCTURE WITH EMBEDDED LAYER FOR POST-PROCESSING SILICON HANDLE ELIMINATION

RELATED APPLICATIONS

This application is a divisional of U.S. patent application Ser. No. 15/085,185, filed on Mar. 30, 2016, which claims the benefit of provisional patent application No. 62/165,446, filed on May 22, 2015, the disclosures of which are hereby incorporated herein by reference in their entirety.

FIELD OF THE DISCLOSURE

The present disclosure relates to a substrate structure used in semiconductor manufacturing, and more particularly to a substrate structure with a buried dielectric layer for post-processing silicon handle elimination.

BACKGROUND

The wide utilization of cellular and wireless devices drives the rapid development of radio frequency (RF) technologies. The substrates on which RF devices are fabricated play an important role in achieving high level performance in the RF technologies. RF complementary metal-oxide semiconductor (CMOS) and RF micro-electro-mechanical system (MEMS) technologies fabricated on silicon on insulator (SOI) substrates have attracted extensive attention in recent years. Fabrications of these RF technologies on SOI substrates may benefit from low cost of silicon materials, a large scale capacity of wafer production, well-established semiconductor design tools, and well-established semiconductor manufacturing techniques.

Despite the benefits of using SOI substrates and conventional semiconductor manufacturing techniques for RFCMOS and RFMEMS fabrications, it is well known in the industry that a silicon handle layer in the SOI substrate has two undesirable properties that limit the SOI's usage in critical, RF large signal applications: harmonic generations and low resistivity values. By using SOI substrates in RF fabrications, an interface between the silicon handle layer and an adjacent insulator layer will generate significant harmonic signals. RF signals of power levels employed in cellular and other wireless applications are RF signals coupled to this interface and therefore experience significant deterioration with the creation of unwanted harmonic and intermodulation products. Such spectrum degradation causes a number of significant system issues such as unwanted generation of signals in other RF bands which the system is attempting to avoid. In addition, unlike gallium arsenide (GaAs), the silicon handle layer does not have high resistivity values. The relatively low resistivity encountered in the silicon handle layer also limits the performance and quality factor of passive components, such as inductors, transmission lines, and couplers, by the generation of unwanted RF current loss in the silicon handle layer.

Accordingly, there remains a need for improved substrate designs to benefit from high fabrication yields and low cost of silicon manufacturing without bearing deleterious harmonic generations. In addition, there is also a need to enhance the resistivity values of the substrates in final RF products.

SUMMARY

The present disclosure relates to a substrate structure with a buried dielectric layer for post-processing silicon handle elimination. The substrate structure includes a silicon handle layer, a first silicon oxide layer over the silicon handle layer, a buried dielectric layer over the first silicon oxide layer, where the buried dielectric layer is not formed from silicon oxide, a second silicon oxide layer over the buried dielectric layer, and a silicon epitaxy layer over the second silicon oxide layer. The buried dielectric layer may be formed from silicon nitride, which provides selective etch stop characteristics with respect to etching chemistries for silicon and silicon oxide.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIGS. 5A-5F illustrate the steps associated with the exemplary process provided in FIG. 4.

Figure 1:
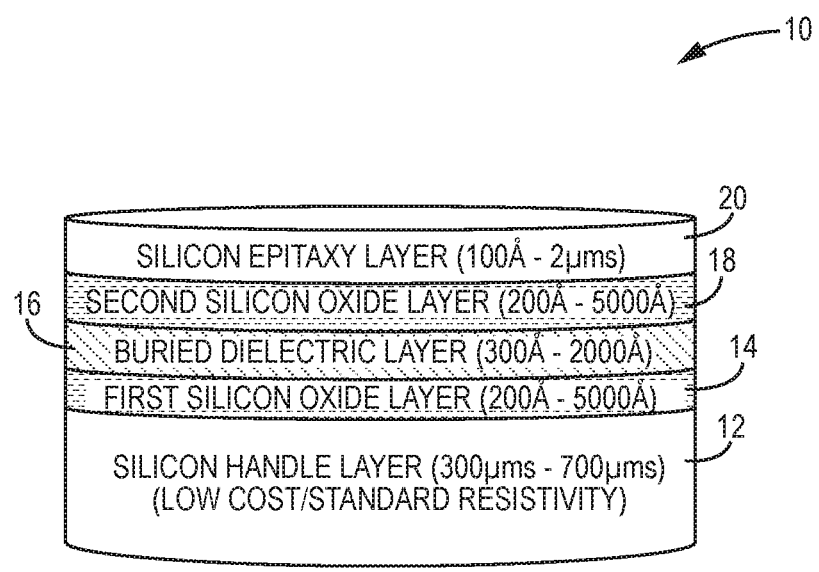
FIG. 1 shows an exemplary substrate structure with a buried dielectric layer according to one embodiment of the present disclosure.

It will be understood that for clear illustrations, FIGS. 1-5 may not be drawn to scale.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 provides a substrate structure 10 according to one embodiment of the present disclosure. In this embodiment, the substrate structure 10 includes a silicon handle layer 12, a first silicon oxide layer 14 over the silicon handle layer 12, a buried dielectric layer 16 over the first silicon oxide layer 14, a second silicon oxide layer 18 over the buried dielectric layer 16, and a silicon epitaxy layer 20 over the second silicon oxide layer 18. The silicon epitaxy layer 20 has a ground surface that is opposite the second silicon oxide layer 18.

In detail, the silicon handle layer 12 is formed by a low cost silicon material, which has no requirement for high resistivity or low harmonic generation. A thickness of the silicon handle layer 12 is thicker than 100 µms, where 300 µms-700 µms is a typical range. Both the first silicon oxide layer 14 and the second silicon oxide layer 18 have a thickness between 200 Angstrom (Å) and 5000 Å. In some applications, the first silicon oxide layer 14 may not exist in the substrate structure 10. The buried dielectric layer 16 is sandwiched between the first silicon oxide layer 14 and the second silicon oxide layer 18.

The buried dielectric layer 16 provides highly selective etch stop characteristics with respect to etching chemistries for silicon and silicon oxide. Also, the buried dielectric layer 16 is smooth and thin enough so as to not create a significant increase in the thermal resistance of devices built with this technology. A thickness of the buried dielectric layer 16 is between 300 Å and 2000 Å. One possible material used to form the buried dielectric layer 16 is silicon nitride, which provides selective etch stop characteristics with respect to etching chemistries for silicon and silicon oxide. The silicon nitride used for the buried dielectric layer 16 also provides a barrier to moisture and other possible chemical contaminants, such as sodium and potassium ions, which may cause significant device reliability issues. Other materials, such as Aluminum Nitride (both piezoelectric and non-piezoelectric options), alumina ($Al_2O_3$), Beryllium Oxide (BeO), and other suitable compounds may also be used to form the buried dielectric layer 16.

The silicon epitaxy layer 20 is formed from a device grade silicon material, which has desired silicon epitaxy characteristics to form electronic components. The silicon epitaxy layer 20 has higher resistivity than the silicon handle layer 12 and the silicon epitaxy layer 20 has lower harmonic generation than the silicon handle layer 12. In general, the resistivity of the silicon epitaxy layer 20 is between 1 ohm/cm and 50 ohm/cm depending on different fabrication processes. A thickness of the silicon epitaxy layer 20 is between 100 Å and 2 µms, where 500 Å-1 µm is a typical range for radio frequency power applications. Those skilled in the art will recognize that the present disclosure may be practiced in a number of different substrate diameters. Typical implementations in today's industry would yield final substrate structure in a 200 mm or 300 mm diameter.

Figure 2:
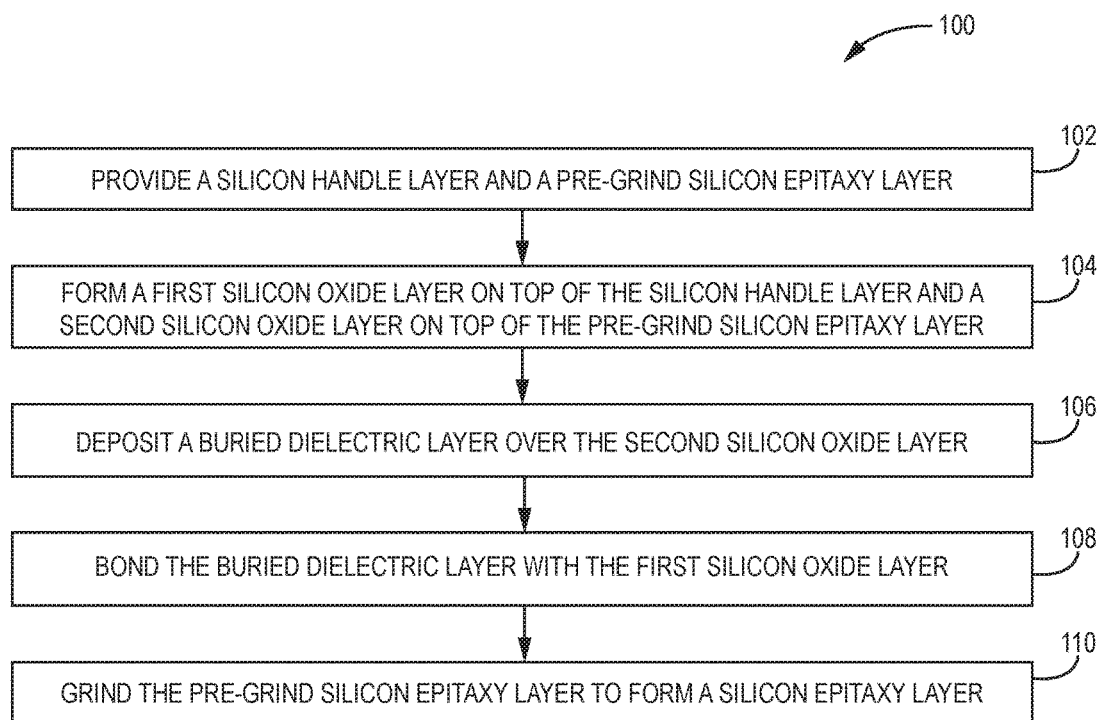
FIG. 2 provides a flow diagram that illustrates an exemplary process to fabricate the exemplary substrate structure shown in FIG. 1.

FIG. 2 provides a flow diagram that illustrates an exemplary process 100 to fabricate the substrate structure shown in FIG. 1. FIGS. 3A-3E illustrate the steps associated with the exemplary process 100 provided in FIG. 2. Although the exemplary process 100 is illustrated as a series of sequential steps, the exemplary process 100 is not necessarily order dependent. Some operations may be done in a different order than that presented. Further, processes within the scope of this disclosure may include fewer or more operations than those illustrated in FIG. 2.

Figure 3A:
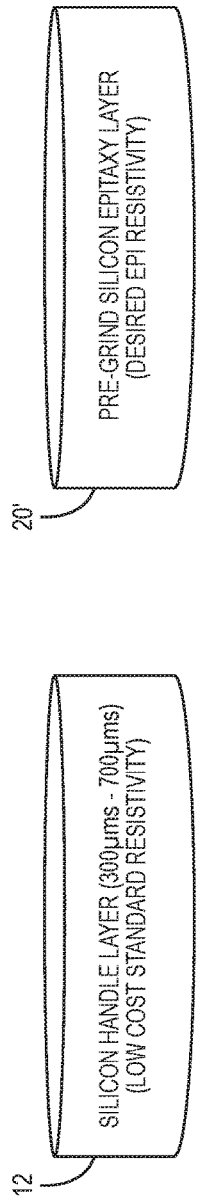
FIGS. 3A-3E illustrate the steps associated with the exemplary process provided in FIG. 2.
Figure 3B:
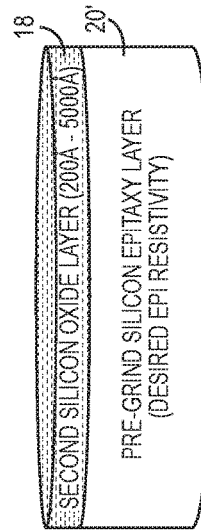
Figure 3B:
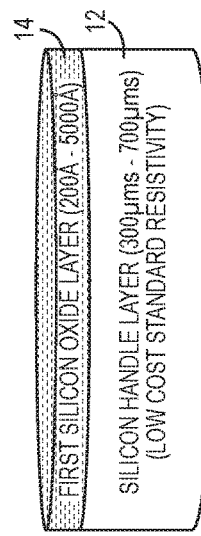

Initially, the silicon handle layer 12 and a pre-grind silicon epitaxy layer 20' are provided as depicted in FIG. 3A (Step 102). Then, the first silicon oxide layer 14 is formed over the silicon handle layer 12 and the second silicon oxide layer 18 is formed over the pre-grind silicon epitaxy layer 20' as depicted in FIG. 3B (Step 104). The first silicon oxide layer 14 and the second silicon oxide layer 18 may be formed by thermally oxidizing the silicon handle layer 12 and the pre-grind silicon epitaxy layer 20' in a conventional oxidation furnace, respectively. Herein, the formation of the first silicon oxide layer 14 is optional.

Figure 3C:
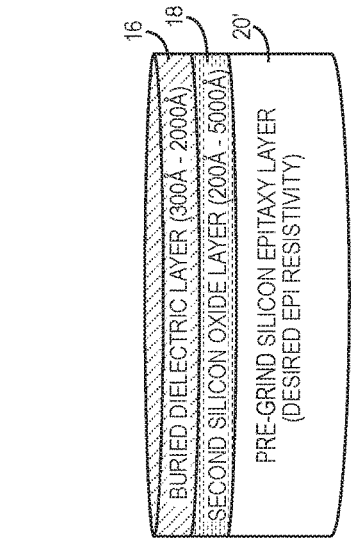

The buried dielectric layer 16 is then deposited over the second silicon oxide layer 18 as depicted in FIG. 3C (Step 106). The depositing process may be implemented by a number of conventional dielectric deposition techniques such as plasma enhanced chemical vapor deposition or low pressure chemical vapor deposition. In some applications, the buried dielectric layer 16 may be deposited over the first silicon oxide layer 14 instead.

Figure 3E:
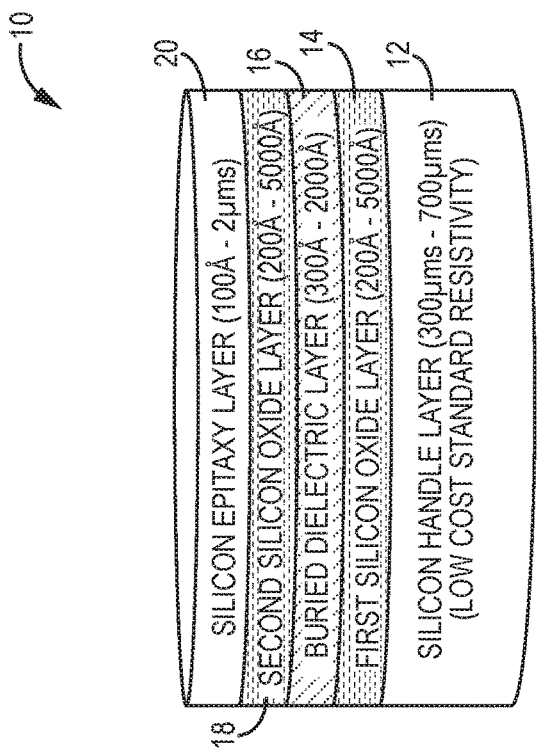
Figure 3D:
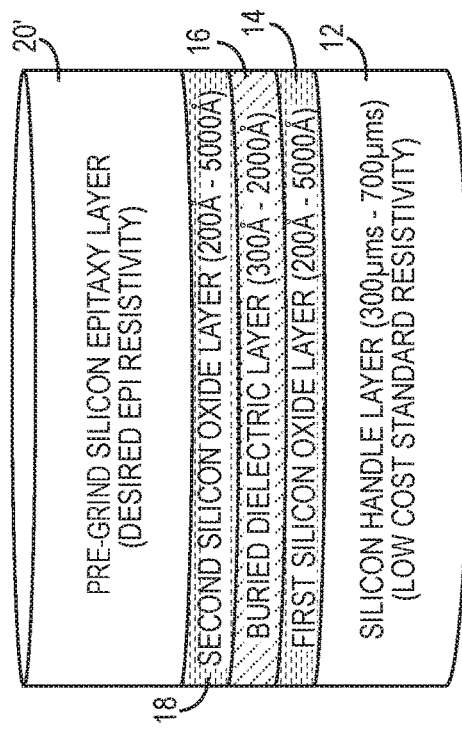

Next, the buried dielectric layer 16 is bonded with the first silicon oxide layer 14, such that the buried dielectric layer 16 is sandwiched between the first silicon oxide layer 14 and the second silicon oxide layer 18 as depicted in FIG. 3D (Step 108). The bonding process may be implemented by a number of different wafer bonding techniques such as anodic bonding, fusion bonding, low temperature glass assisted bonding, or ionic bonding. Some of these bonding techniques may require the deposition of a third silicon oxide layer (not shown) over the buried dielectric layer 16 before bonding to the first silicon oxide layer 14. This third oxide layer may facilitate the bonding process since it provides similar materials to both surfaces which are to be bonded. In another embodiment, if there is no first silicon oxide layer 14 formed in Step 104, the buried dielectric layer 16 is directly bonded with the silicon handle layer 12. The parameters for the bonding process, such as temperature and pressure, have to be engineered to manage the mismatches in thermal expansion and stress levels of the different layers that are comprised in the substrate structure.

Finally, the pre-grind silicon epitaxy layer 20' is ground to form the silicon epitaxy layer 20 as depicted in FIG. 3E (Step 110). A thickness of the silicon epitaxy layer 20 is between 100 Å and 2 μms depending on different applications. For example, if the silicon epitaxy layer 20 is used to form radio frequency power electronics components, the thickness of the silicon epitaxy layer 20 is between 500 Å and 1 μm. In another example, the silicon epitaxy layer 20 may be completely absent from applications such as integrated passive devices (IPD) or micro electro mechanical system (MEMS) technologies. The grinding process may be implemented by a number of conventional chemical/mechanical polishing steps.

Figure 4:
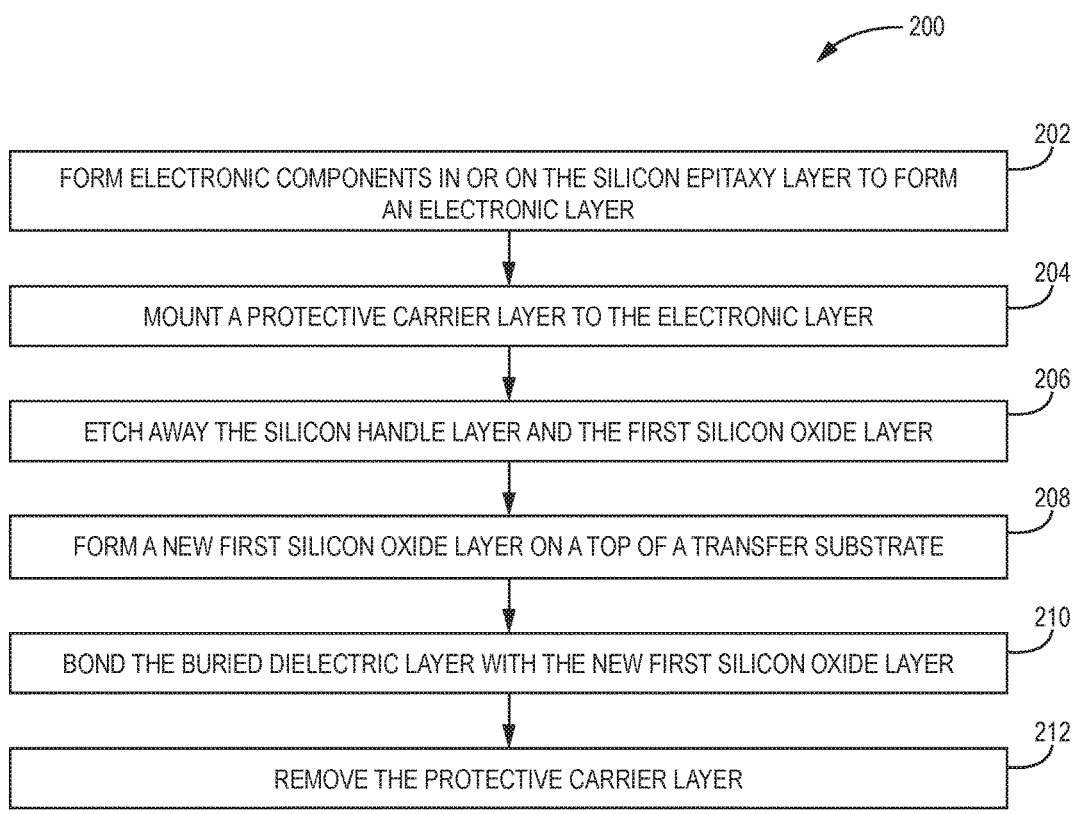
FIG. 4 provides a flow diagram that illustrates an exemplary process to fabricate a device using the substrate structure shown in FIG. 1.

FIG. 4 provides a flow diagram that illustrates an exemplary process 200 to fabricate a device using the substrate structure 10 described above. FIGS. 5A-5F illustrate the steps associated with the exemplary process 200 provided in FIG. 4. Although the exemplary process 200 is illustrated as a series of sequential steps, the exemplary process 200 is not necessarily order dependent. Some operations may be done in a different order than that presented. Further, processes within the scope of this disclosure may include fewer or more operations than those illustrated in FIG. 4.

Figure 5A:
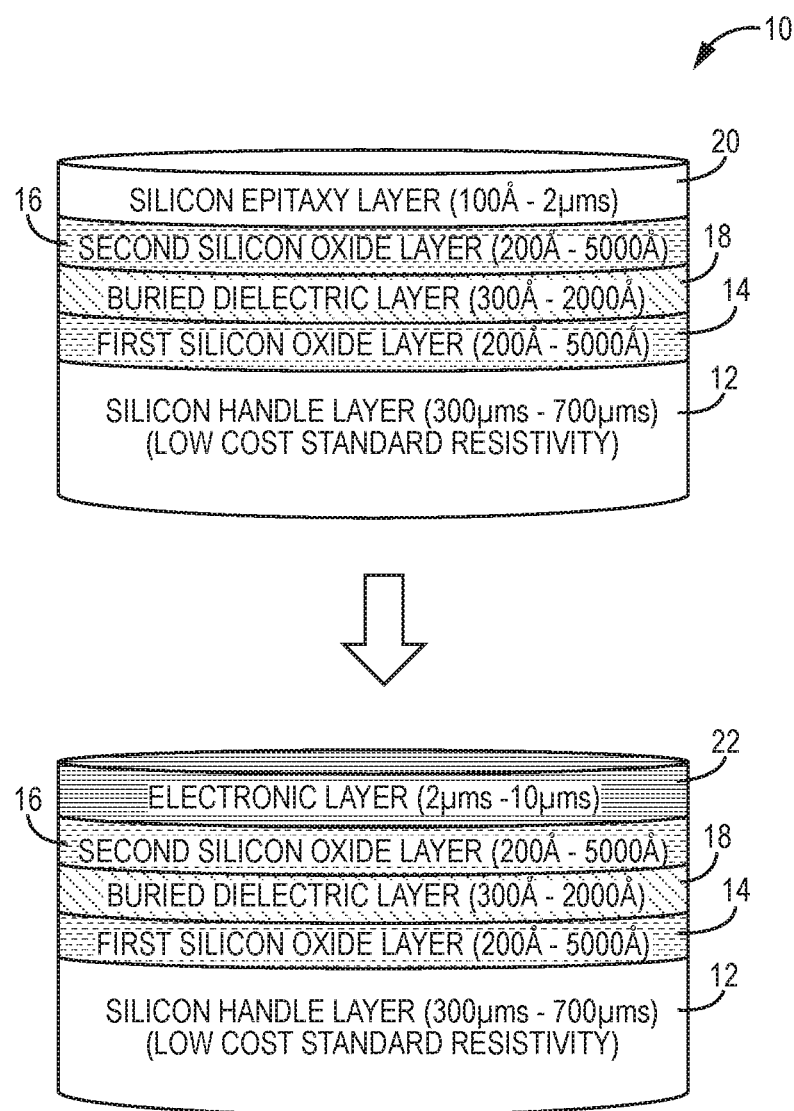

After the substrate structure 10 is formed, electronic components may be integrated in or on the silicon epitaxy layer 20 to form an electronic layer 22 as depicted in FIG. 5A (Step 202). The formed electronic layer 22 may have a different thickness from the silicon epitaxy layer 20, between 2 μms and 10 μms. If the substrate structure 10 does not include the silicon epitaxy layer 20 for some applications, such as IPD or MEMS, a conventional method including an oxidation/deposition process is used to form the electronic layer 22.

Figure 5B:
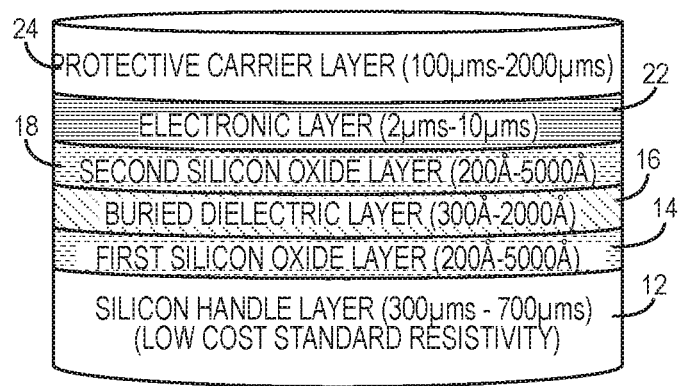

Next, a protective carrier layer 24 is mounted to the electronic layer 22 as depicted in FIG. 5B (Step 204). Normally, the protective carrier layer 24 has a thickness between 100 μms and 2000 μms. The mounting process may be implemented by simple conventional adhesive techniques or wafer bonding techniques.

After the protective carrier layer 24 is mounted to the electronic layer 22, the silicon handle layer 12 and the first silicon oxide layer 14 are removed as depicted in FIG. 5C (Step 206). The removal process may be implemented by wet/dry chemical etching techniques.

Well known etching chemistries used in wet/dry chemical etching techniques are potassium hydroxide/isopropyl alcohol (KOH/IPA), ethylenediamine pyrocatechol (EDP), and tetramethylammonium hydroxide (THAH). All of these etching chemistries etch silicon as well as silicon oxide, where the silicon is etched faster than the silicon oxide. However, none of these etching chemistries can etch silicon nitride at any appreciable rate. Notice that without the introduction of the buried dielectric layer 16, it would be extremely difficult to completely etch the thick silicon handle layer 12 and completely stop the etching process in a much thinner silicon oxide layer (the first silicon oxide layer 14 plus the second silicon oxide layer 18). Although these etching chemistries etch silicon at a much faster rate than silicon oxide—for example, KOH etches silicon at a rate 30-50 times faster than silicon oxide—, the silicon oxide layer (the first silicon oxide layer 14 plus the second silicon oxide layer 18) alone cannot offer the control to completely eliminate the silicon handle layer 12 without the risk of puncturing the electronic layer 22. The reason is the silicon oxide layer (the first silicon oxide layer 14 plus the second silicon oxide layer 18) is thousands of times thinner than the silicon handle layer 12 and only has an Angstrom level thickness. During the removal process, the silicon handle layer 12 must be eliminated completely, while a portion of the first buried oxide layer 14 is allowed to remain.

In the meantime, a new first silicon oxide layer 14N is formed on a top of a transfer substrate layer 26 as depicted in FIG. 5D (Step 208). The transfer substrate layer 26 does not include single crystal silicon and may be formed from polymer, ceramic, or gallium arsenide (GaAs) materials. A thickness of the transfer substrate layer 26 is between 50 μms and 2500 μms. A thickness of the new first silicon oxide layer 14N is between 200 Å and 5000 Å.

Figure 5E:
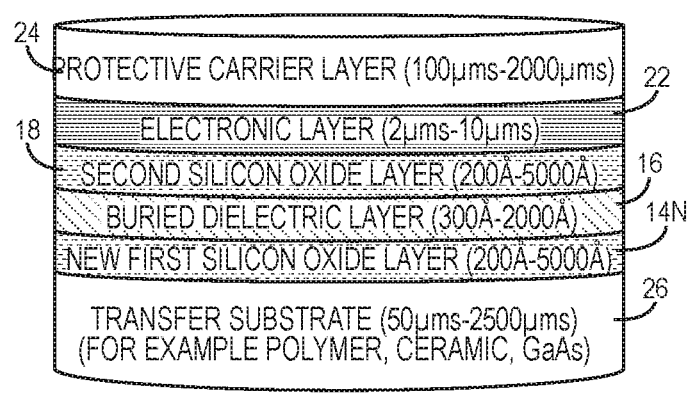
Figure 5F:
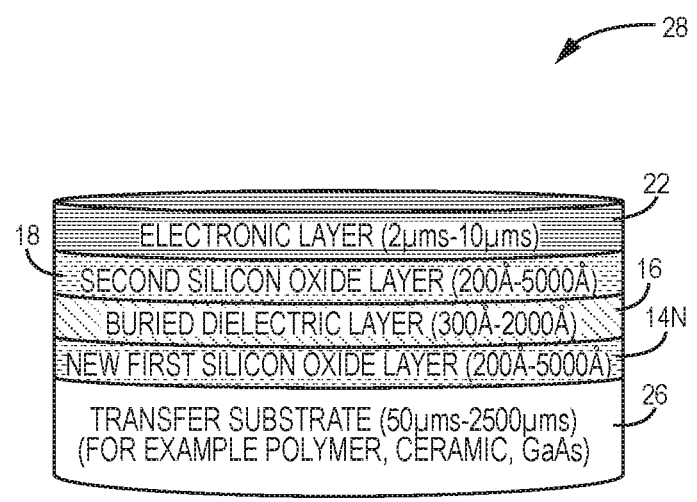

Next, the buried dielectric layer 16 is bonded with the new first silicon oxide layer 14N, such that the buried dielectric layer 16 is sandwiched between the new first silicon oxide layer 14N and the second silicon oxide layer 18 as depicted in FIG. 5E (Step 210). The bonding process may be implemented by anodic bonding, fusion bonding, low temperature glass assisted bonding, or ionic bonding. If there is a portion of the first silicon oxide layer 14 remaining in Step 206 (not shown in FIG. 5C), the bonding process is to bond the remaining portion of the first silicon oxide layer 14 with the new silicon oxide layer 14N. The buried dielectric layer 16 is still sandwiched between the two silicon oxide layers. In some applications, there is no silicon oxide layer required between the buried dielectric layer 16 and the transfer substrate layer 26. Consequently, Step 208 may be omitted. In Step 210, the transfer substrate layer 26 is directly bonded with the buried dielectric layer 16 or bonded with the remaining portion of the first silicon oxide layer 14 (not shown). Lastly, the protective carrier layer 24 is removed to form a device 28 as depicted in FIG. 5F (Step 212). In some applications, like wafer level fan out (WLFO), the transfer substrate layer 26 is not necessary. Thereby the process steps 208 and 210 shown in FIGS. 5D and 5E are optional.

According to one embodiment of the present disclosure, the final device 28 as shown in FIG. 5F includes the transfer substrate layer 26, which does not include silicon, the new silicon oxide layer 14N over the transfer substrate layer 26, the buried dielectric layer 16 over the new silicon oxide layer 14N, where the buried dielectric layer 16 is not formed from silicon oxide, the second silicon oxide layer 18 over the buried dielectric layer 16, and the electronic components layer 22 over the second silicon oxide layer 18. This unique combination of layers yields a low cost fabrication technology suitable for use in RF applications, which benefit from the removal of the silicon handle layer.

Those skilled in the art will recognize improvements and modifications to the embodiments of the present disclosure. All such improvements and modifications are considered within the scope of the concepts disclosed herein and the claims that follow.

What is claimed is:

1. A method comprising:
   forming a device precursor that comprises a silicon handle layer, a buried dielectric layer over the silicon handle layer, an upper silicon oxide layer over the buried dielectric layer, and an electronic layer over the upper silicon oxide layer, wherein the buried dielectric layer is not formed from silicon oxide;

removing the silicon handle layer; and bonding a transfer substrate layer to the buried dielectric layer, wherein the transfer substrate layer does not comprise single crystal silicon.

2. The method of claim 1 wherein removing the silicon handle layer is implemented by etching away the silicon handle layer with an etchant.

3. The method of claim 2 wherein the buried dielectric layer provides a barrier withstanding the etchant.

4. The method of claim 1 wherein the device precursor further comprises a lower silicon oxide layer residing between the silicon handle layer and the buried dielectric layer.

5. The method of claim 4 further comprising removing the lower silicon oxide layer with the silicon handle layer before bonding the transfer substrate layer to the buried dielectric layer.

6. The method of claim 5 further comprising forming a first silicon oxide layer over the transfer substrate layer, such that bonding the transfer substrate layer to the buried dielectric layer is implemented by directly bonding the first silicon oxide layer to the buried dielectric layer, wherein the buried dielectric layer is sandwiched between the first silicon oxide layer and the upper silicon oxide layer.

7. The method of claim 4 wherein a thickness of the electronic layer is between 2 µm and 10 µm, a thickness of the upper silicon oxide layer is between 200 Å and 5000 Å, a thickness of the buried dielectric layer is between 300 Å and 2000 Å, a thickness of the lower silicon oxide layer is between 200 Å and 5000 Å, and a thickness of the transfer substrate layer is between 50 µm and 2500 µm.

8. The method of claim 1 wherein the transfer substrate layer is directly connected to the buried dielectric layer.

9. The method of claim 1 further comprising mounting a protective carrier layer over the electronic layer before removing the silicon handle layer.

10. The method of claim 9 further comprising removing the protective carrier layer after bonding the transfer substrate layer to the buried dielectric layer.

11. The method of claim 1 wherein the buried dielectric layer is formed from silicon nitride.

12. The method of claim 1 wherein the transfer substrate layer is formed from one of a group consisting of polymer, ceramic, and gallium arsenide.

13. The method of claim 1 wherein a thickness of the transfer substrate layer is between 50 µm and 2500 µm.

14. The method of claim 1 wherein a thickness of the electronic layer is between 2 µm and 10 µm.

15. The method of claim 1 wherein a thickness of the upper silicon oxide layer is between 200 Å and 5000 Å, and a thickness of the buried dielectric layer is between 300 Å and 2000 Å.

16. The method of claim 1 wherein bonding the transfer substrate layer to the buried dielectric layer is implemented by one of a group consisting of anodic bonding, fusion bonding, low temperature glass assisted bonding, and ionic bonding.

17. The method of claim 1 wherein forming the device precursor comprises:

providing the silicon handle layer and a pre-grind silicon epitaxy layer;

forming the upper silicon oxide layer over the pre-grind silicon epitaxy layer;

depositing the buried dielectric layer over the upper silicon oxide layer;

bonding the silicon handle layer to the buried dielectric layer;

grinding a first surface of the pre-grind silicon epitaxy layer, which is opposite the upper silicon oxide layer, to form a silicon epitaxy layer; and forming electronic components in or on the silicon epitaxy layer to form the electronic layer.

18. The method of claim 17 further comprising forming a lower silicon oxide layer over the silicon handle layer before bonding the silicon handle layer to the buried dielectric layer.

19. The method of claim 18 wherein bonding the silicon handle layer to the buried dielectric layer is implemented by directly bonding the lower silicon oxide layer to the buried dielectric layer, such that the buried dielectric layer is sandwiched between the lower silicon oxide layer and the upper silicon oxide layer.

20. The method of claim 17 wherein the silicon epitaxy layer has a higher resistivity than the silicon handle layer and the silicon epitaxy layer has lower harmonic generation than the silicon handle layer.

* * * * *